(12) United States Patent
Jeong

(10) Patent No.: US 8,686,456 B2
(45) Date of Patent: Apr. 1, 2014

(54) LIGHT EMITTING DEVICE, LIGHT EMITTING DEVICE PACKAGE, AND LIGHT UNIT

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/217,526

(22) Filed: Aug. 25, 2011

(65) Prior Publication Data

US 2012/0049226 A1    Mar. 1, 2012

(30) Foreign Application Priority Data

Aug. 26, 2010    (KR) .......................... 10-2010-0083162

(51) Int. Cl.
*H01L 33/00* (2010.01)
*H01L 21/00* (2006.01)

(52) U.S. Cl.
USPC .............................................. 257/98; 438/29

(58) Field of Classification Search
USPC .............. 257/13, 79–103, 918, 40, 642–643, 257/759; 438/27, 28, 29, 31, 32
See application file for complete search history.

(56) References Cited

U.S. PATENT DOCUMENTS

| 7,737,459 | B2 | 6/2010 | Edmond et al. | 257/99 |
|---|---|---|---|---|
| 8,115,224 | B2 | 2/2012 | Kim | 257/98 |
| 8,154,046 | B2 | 4/2012 | Lee et al. | 257/99 |
| 8,269,250 | B2 | 9/2012 | Jeong | 257/99 |
| 8,319,227 | B2 | 11/2012 | Cho | 257/79 |
| 2009/0008668 | A1* | 1/2009 | Matsumura | 257/98 |
| 2009/0242918 | A1* | 10/2009 | Edmond et al. | 257/98 |
| 2010/0181586 | A1* | 7/2010 | Kim | 257/98 |
| 2010/0200884 | A1* | 8/2010 | Lee et al. | 257/98 |
| 2010/0207141 | A1* | 8/2010 | Cho | 257/98 |
| 2010/0207159 | A1* | 8/2010 | Jeong | 257/103 |

FOREIGN PATENT DOCUMENTS

| CN | 101027784 | 8/2007 |
|---|---|---|
| CN | 101783382 | 7/2010 |
| CN | 101800277 | 8/2010 |
| CN | 101807638 | 8/2010 |
| CN | 101807643 | 8/2010 |

* cited by examiner

*Primary Examiner* — Julio J Maldonado
*Assistant Examiner* — Moin Rahman
(74) *Attorney, Agent, or Firm* — Ked & Associates, LLP

(57) ABSTRACT

Provided are a light emitting device, a light emitting device package, and a light unit. The light emitting device includes a support substrate, a light emitting structure layer disposed on the support substrate, the light emitting structure layer including a first conductive type semiconductor layer, a second conductive type semiconductor layer, and an active layer disposed between the first conductive type semiconductor layer and the second conductive type semiconductor layer, an electrode electrically connected to the first conductive type semiconductor layer, and a volume layer disposed on the light emitting structure layer, the volume layer having a thickness greater than a thickness of the electrode.

22 Claims, 22 Drawing Sheets

LIGHT EMITTING DEVICE, LIGHT EMITTING DEVICE PACKAGE, AND LIGHT UNIT

CROSS-REFERENCE TO RELATED APPLICATIONS

The present application claims priority under 35 U.S.C. 119 to Korean Patent Application No. 10-2010-0083162 filed on Aug. 26, 2010, which is hereby incorporated by reference in its entirety.

BACKGROUND

The present disclosure relates to a light emitting device, a light emitting device package, and a light unit.

The light emitting devices are a kind of semiconductor device for converting electrical energy into light. Examples of the light emitting devices may comprise light emitting diodes and laser diodes. Such a light emitting device has advantages such as low power consumption, a semi-permanent life cycle, a fast response time, safety, and environment friendly compared to the related art light source such as a fluorescent lamp and an incandescent bulb.

Many studies are being in progress in order to replace the existing light sources with light emitting devices. Also, the light emitting devices are being increasingly used according to the trend as light sources of a variety of lamps used in indoor and outdoor places and lighting devices such as liquid crystal display devices, scoreboards, and streetlamps.

SUMMARY

Embodiments provide a light emitting device having improved light extraction efficiency and a wide orientation angle, a light emitting device package, and a light unit.

In one embodiment, a light emitting device provides: a support substrate; a light emitting structure layer disposed on the support substrate, the light emitting structure layer comprising a first conductive type semiconductor layer, a second conductive type semiconductor layer, and an active layer disposed between the first conductive type semiconductor layer and the second conductive type semiconductor layer; an electrode electrically connected to the first conductive type semiconductor layer; and a volume layer disposed on the light emitting structure layer, the volume layer having a thickness greater than a thickness of the electrode.

In another embodiment, a light emitting device package comprises: a body; a light emitting device disposed on the body; and first and second electrode layers electrically connected to the light emitting device, wherein the light emitting device comprises: a support substrate; a light emitting structure layer disposed on the support substrate, the light emitting structure layer comprising a first conductive type semiconductor layer, a second conductive type semiconductor layer, and an active layer disposed between the first conductive type semiconductor layer and the second conductive type semiconductor layer; an electrode electrically connected to the first conductive type semiconductor layer; and a volume layer disposed on the light emitting structure layer, the volume layer having a thickness greater than a thickness of the electrode.

In further another embodiment, a light unit comprises: a board; a light emitting device disposed on the board; and an optical member through which light emitted from the light emitting device passes, wherein the light emitting device comprises: a support substrate; a light emitting structure layer disposed on the support substrate, the light emitting structure layer including a first conductive type semiconductor layer, a second conductive type semiconductor layer, and an active layer disposed between the first conductive type semiconductor layer and the second conductive type semiconductor layer; an electrode electrically connected to the first conductive type semiconductor layer; and a volume layer disposed on the light emitting structure layer, the volume layer having a thickness greater than a thickness of the electrode.

DETAILED DESCRIPTION OF THE EMBODIMENTS

Figure 1:
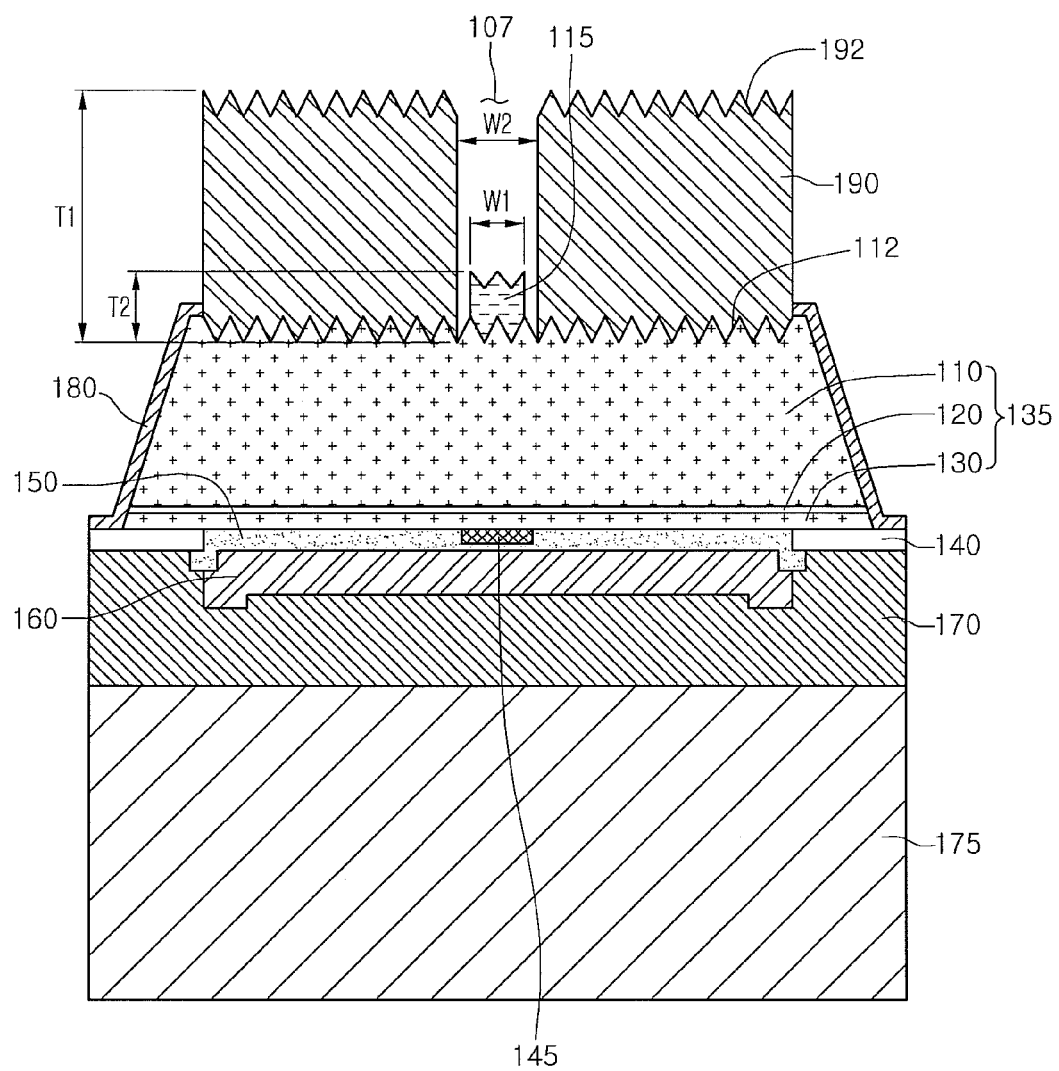
FIG. 1 is a sectional view of a light emitting device according to an embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. In the drawings, the thickness or size of each layer is exaggerated, omitted, or schematically illustrated for convenience in description and clarity.

Hereinafter, embodiments will be described with reference to the accompanying drawings.

FIG. 1 is a sectional view of a light emitting device according to an embodiment.

Referring to FIG. 1, a light emitting device 100 according to an embodiment comprises a conductive support substrate 175, a light emitting structure layer 135 disposed on the conductive support substrate 175 to generate light, and an electrode 115 on the light emitting structure layer 135.

The light emitting structure layer 135 may comprise a first conductive type semiconductor layer 110, an active layer 120, and a second conductive type semiconductor layer 130. Electrons and holes supplied from the first and second conductive type semiconductor layers 110 and 130 may be recombined with each other in the active layer 120 to generate light.

An adhesion layer 170, a reflective layer 160, an ohmic contact layer 150, a current blocking layer (CBL) 145, and a protection member 140 may be disposed between the conductive support substrate 175 and the light emitting structure layer 135. A passivation layer 180 may be disposed on a side surface of the light emitting structure layer 135.

The conductive support substrate 175 may support the light emitting structure layer 135 to provide a power into the light emitting structure layer 135 together with the electrode 115. For example, the conductive support substrate 175 may be formed of at least one of copper (Cu), gold (Au), nickel (Ni), molybdenum (Mo), Cu—W, Si, Ge, GaAs, ZnO, and SiC. However, the present disclosure is not limited thereto. For example, an insulating substrate replaced with the conductive support substrate 175 may be used to form a separate electrode.

The conductive support substrate 175 may have a thickness of about 30 μm to about 500 μm. However, the present disclosure is not limited thereto. For example, the conductive support substrate 175 may have a thickness varied according to a design of the light emitting device 100.

The adhesion layer 170 may be disposed on the conductive support substrate 175. The adhesion layer 170 may serve as a bonding layer. Also, the adhesion layer 170 may be disposed under the reflective layer 160 and the protection member 140. The adhesion layer 170 may contact the reflective layer 160, an end of the ohmic layer 150, and the protection member 140 to enhance an adhesion between the reflective layer 160, the ohmic layer 150, and the protection member 140.

The adhesion layer 170 may be formed of a barrier metal or a bonding metal. For example, the adhesion layer 170 may be formed of at least one of Ti, Au, Sn, Ni, Cr, Ga, In, Bi, Cu, Al, Si, Ag and Ta.

The adhesion layer 170 may be disposed on the reflective layer 160. The reflective layer 160 may reflect light which is emitted from the light emitting structure layer 135 toward the reflective layer 160 to improve light emitting efficiency of the light emitting device 100.

For example, the reflective layer 160 may be formed of at least one of Ag, Ni, Al, Rh, Pd, Ir, Ru, Mg, Zn, Pt, Au, Hf, and alloys thereof. Also, the reflective layer 160 may be realized as a multi-layer using the above-described metal or alloy and a light-transmitting conductive material such as tin oxide (ITO), indium zinc oxide (IZO), indium zinc tin oxide (IZTO), indium aluminum zinc oxide (IAZO), indium gallium tin oxide (IGTO), indium gallium zinc oxide (IGZO), aluminum zinc oxide (AZO), or antimony tin oxide (ATO). For example, the reflective layer 160 may have a stacked structure of IZO/Ni, AZO/Ag, IZO/Ag/Ni, AZO/Ag/Ni, Ag/Cu, or Ag/Pd/Cu.

The ohmic layer 150 may be disposed on the reflective layer 160. The ohmic layer 150 may ohmic-contact the second conductive type semiconductor layer 130 to smoothly supply a power into the light emitting structure layer 135. The ohmic layer 150 may be realized as a single or multi-layer using at least one of ITO, IZO, IZTO, IAZO, IGZO, IGTO, AZO, ATO, GZO (gallium zinc oxide), IrO$_x$, RuO$_x$, RuO$_x$/ITO, Ni, Ag, Pt, Ni/IrO$_x$/Au, and Ni/IrO$_x$/Au/ITO.

As described above, a structure in which a top surface of the reflective layer 160 contacts the ohmic layer 150 is described as an example in the current embodiment. However, the reflective layer 160 may contact the protection member 140, the CBL 145, or the light emitting structure layer 135.

The CBL 145 may be disposed between the ohmic layer 150 and the second conductive type semiconductor layer 130. The CBL 145 may have a top surface contacting the second conductive type semiconductor layer 130 and lower and side surfaces contacting the ohmic layer 150.

The CBL 145 may be disposed so that at least one portion thereof vertically overlaps the electrode 115. Accordingly, a phenomenon in which a current is concentrated into the shortest distance between the electrode 115 and the conductive support substrate 175 may be reduced to improve the light emitting efficiency of the light emitting device 100.

The CBL 145 may be formed of an electrically insulating material, a material having low electrical conductivity than that of the reflective layer 160 or the adhesion layer 170, or a material in schottky-contact with the second conductive type semiconductor layer 130. For example, the CBL 145 may be formed of at least one of ITO, IZO, IZTO, IAZO, IGZO, IGTO, AZO, ATO, ZnO, Si$_2$, SiO$_x$, SiO$_x$N$_y$, Si$_3$N$_4$, Al$_2$O$_3$, TiO$_x$, TiO$_2$, Ti, Al, and Cr.

As described above, although the ohmic layer 150 contacts the bottom and side surfaces of the CLB 145, the present disclosure is not limited thereto. Thus, although the ohmic layer 150 and the CBL 145 are spaced from each other, the ohmic layer 150 may contact only the side surfaces of the CBL 145. Alternatively, the CBL 145 may be disposed between the reflective layer 160 and the ohmic layer 150.

The protection member 140 may be disposed on a circumference of a top surface of the adhesion layer 170. That is, the protection member 140 may be disposed on a circumference between the light emitting structure layer 135 and the adhesion layer 170. The protection member 140 may have a ring shape, a loop shape, or a frame shape. A portion of the protective member 140 may vertically overlap the light emitting structure layer 135.

The protection member 140 may increase a distance of a side surface between the adhesion layer 170 and the active layer 120 to prevent the adhesion layer 170 and the active layer 120 from being electrically short-circuit with each other. Also, the protection member 140 may prevent moisture from being permeated through a gap between the light emitting structure layer 135 and the conductive support member 175.

In addition, the protection member 140 may prevent electrical short-circuit from occurring in a chip separation process. In more detail, when an isolation etching process is performed on the light emitting structure layer 135 to separate the light emitting structure layer 135 into unit chip areas, fragments generated in the adhesion layer 170 may be attached between the second conductive type semiconductor layer 130 and the active layer 120 or between the active layer 120 and the first conductive type semiconductor layer 110 to cause the electrical short-circuit. The protection member 140 may prevent the electrical short-circuit from occurring. The protection member 140 may be formed of a material which is not broken or does not generate fragments during the isolation etching process or a material which is not electrically short-circuited even though a small part thereof is broken or the small amount of fragments is generated. The protection member 140 may be called an isolation layer or a channel layer.

The protection member 140 may be formed of an electrically insulating material, a material having low electrical conductivity than that of the reflective layer 160 or the adhesion layer 170, or a material in schottky-contact with the second conductive type semiconductor layer 130. For example, the protection member 140 may be formed of at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al, and Cr.

Also, the light emitting structure layer 135 may be disposed on the ohmic layer 150 and the protection member 140. The light emitting structure layer 135 may have inclined side surfaces due to the isolation etching process for dividing a plurality of chips into unit chip areas.

The semiconductor structure layer 135 may comprise a plurality of III-V group compound semiconductor layers. The light emitting structure layer 135 may comprise the first conductive type semiconductor layer 110, the second conductive type semiconductor layer 130, and the active layer 120 disposed between the first conductive type semiconductor layer 110 and the second conductive type semiconductor layer 130. Here, the second conductive type semiconductor layer 130 may be disposed on the ohmic layer 150 and the protection member 140. Also, the active layer 120 may be disposed on the second conductive type semiconductor layer 130, and the first conductive type semiconductor layer 110 may be disposed on the active layer 120.

The first conductive type semiconductor layer 110 may comprise an III-V group compound semiconductor in which a first conductive type dopant is doped. For example, the first conductive type semiconductor layer 110 may comprise an N-type semiconductor layer. The N-type semiconductor layer may be realized by doping an N-type dopant into a semiconductor material having a compositional formula of $In_xAl_yGa_{1-x-y}N$ ($0 \le x \le 1$, $0 \le y \le 1$, $0 \le x+y \le 1$). For example, the first conductive type semiconductor layer 110 may be formed by doping an N-type dopant such as Si, Ge, Sn, Se, or Te into GaN, AlN, AlGaN, InGaN, InN, InAlGaN, AlInN, AlGaAs, GaP, GaAs, GaAsP, or AlGaInP. The first conductive type semiconductor layer 110 may be formed as a single layer or a multi layer, but is not limited thereto.

The active layer 120 may have one of a single quantum well structure, a multi quantum well (MQW) structure, a quantum dot structure, and a quantum wire structure, but is not limited thereto.

The active layer 120 may be formed of a semiconductor material having a compositional formula of $In_xAl_yGa_{1-x-y}N$ ($0 \le x \le 1$, $0 \le y \le 1$, $0 \le x+y \le 1$). When the active layer 120 has the MQW structure, a plurality of well layers and a plurality of barrier layers may be stacked with each other to form the active layer 120. For example, an InGaN well layer and a GaN barrier layer may be alternately stacked with each other to form the active layer 120.

A clad layer which is doped with an N-type or P-type dopant may be disposed on and/or under the active layer 120. The clad layer may comprise an AlGaN layer or an InAlGaN layer.

The second conductive type semiconductor layer 130 may comprise a III-V group compound semiconductor in which a second conductive type dopant is doped. For example, the second conductive type semiconductor layer 130 may comprise a P-type semiconductor layer.

The P-type semiconductor layer may be realized by doping a P-type dopant into a semiconductor material having a compositional formula of $In_xAl_yGa_{1-x-y}N$ ($0 \le x \le 1$, $0 \le y \le 1$, $0 \le x+y \le 1$). For example, the second conductive type semiconductor layer 130 may be formed by doping a P-type dopant such as Mg, Zn, Ca, Sr, or Br into GaN, AlN, AlGaN, InGaN, InN, InAlGaN, AlInN, AlGaAs, GaP, GaAs, GaAsP, or AlGaInP. The second conductive type semiconductor layer 130 may be formed as a single layer or a multi layer, but is not limited thereto.

As described above, the first conductive type semiconductor layer 110 may comprise the P-type semiconductor layer and the second conductive type semiconductor layer 130 may comprise the N-type semiconductor layer. However, the present disclosure is not limited thereto. Thus, the first conductive type semiconductor layer 110 may comprise the P-type semiconductor layer, and the second conductive type semiconductor layer 130 may comprise the N-type semiconductor layer. Also, another N-type or P-type semiconductor layer may be disposed under the second conductive type semiconductor layer 130. Thus, the light emitting structure layer 135 may have at least one of an np junction structure, a pn junction structure, an npn junction structure, and a pnp junction structure. Also, the dopants may be uniformly or non-uniformly doped into the first and second conductive type semiconductor layers 110 and 130, respectively. That is, the light emitting structure layer 135 layer may have various structures, but are not limited to the embodiments.

A light extraction pattern 112 may be disposed on a top surface of the light emitting structure layer 135. The light extraction pattern 112 may minimize the amount of light totally reflected by a surface of the light emitting structure layer 135 to improve the light extraction efficiency of the light emitting device 100. The light extraction pattern 112 may have a random shape and arrangement. Also, the light extraction pattern 112 may have a specific shape and arrangement.

For example, the light extraction pattern 112 may have a photonic crystal structure having a cycle of about 50 nm to about 3,000 nm. The photonic crystal structure may effectively extract light having a specific wavelength range to the outside due to an interference effect.

Also, the light extraction pattern 112 may have various shapes such as a cylindrical shape, a polygonal pillar shape, a cone shape, a polygonal cone shape, a truncated cone, and a polygonal truncated cone, but is not limited thereto.

A volume layer 190 may be disposed on the light emitting structure layer 135. The volume layer 190 may be formed of an insulating and light-transmitting material. For example, the volume layer 190 may be formed of at least one of $SiO_2$, $SiO_x$, $SiO_xN_y$, $Si_3N_4$, and $Al_2O_3$.

Here, the volume layer 190 may be formed of a material having a refractive index less than that of the material (e.g., GaN) for forming the light emitting structure layer 135. Also, when the volume layer 190 is applied to a light emitting device package, the volume layer 190 may be formed of a material having a refractive index greater than that of a molding member (see reference numeral 40 of FIG. 20) for molding the light emitting device 100. As described above, a refractive index may be gradually decreased from the light structure layer 135 to the molding member to improve the external light external efficiency. According to an embodiment, light generated in the light emitting device 100 may be very well emitted to the outside. For example, since $SiO_2$ has a refractive index of about 1.5 and $Al_2O_3$ has a refractive index of about 1.7, the above-described conditions may be satisfied.

In the current embodiment, the volume layer 190 having a predetermined thickness may be disposed on the light emitting structure layer 135 to prevent light generated in the light emitting structure layer 135 from being concentrated in an upper direction. In a vertical type light emitting device when compared to a horizontal type light emitting device, since the light emitting structure layer 135 has a top area greater than a side surface area of the light emitting structure layer 135, light generated in the light emitting structure layer 135 may be concentrately emitted in a vertical direction. However, according to the current embodiment, the volume layer 190 may be provided to allow the light generated in the light emitting structure layer 135 to be emitted upwardly and laterally while passing through the volume layer 190.

In the light emitting device according to an embodiment, efficiency reduction capable of occurring when light extracted to the outside is concentrated in the vertical direction may be prevented. For example, when a light emitting device package is realized using the light emitting device in which light is concentrately emitted in a vertical direction, there may be a limitation that an orientation angle is decreased because light is concentrately emitted in an upper direction. However, according to an embodiment, since light extracted to the outside by the volume layer 190 may be emitted in the upper and lateral directions, a light emitting device package having a wide orientation angle or a wide beam spread of angle may be provided. Also, when a light emitting device package is realized using the light emitting device according to an embodiment, degradation of a phosphor may be effectively prevented.

A second light extraction pattern 192 may be disposed on a top surface of the volume layer 190. The second light extraction pattern 192 may minimize the amount of light totally reflected by a surface thereof to improve the light extraction efficiency of the light emitting device 100. The second light extraction pattern 192 may have a random shape and arrangement. Also, the second light extraction pattern 192 may have a random shape and arrangement.

For example, the second light extraction pattern 192 may have a photonic crystal structure having a cycle of about 50 nm to about 3,000 nm. The photonic crystal structure may effectively extract light having a specific wavelength range to the outside due to an interference effect.

Also, the second light extraction pattern 192 may have various shapes such as a cylindrical shape, a polygonal pillar shape, a cone shape, a polygonal cone shape, a truncated cone, and a polygonal truncated cone, but is not limited thereto.

In the current embodiment, the second light extraction pattern 192 may be disposed on an exposed surface (i.e., a top surface in FIG. 1) of the volume layer 190 to more improve the light extraction efficiency. As described above, although the light extraction pattern 112 is provided to the first conductive type semiconductor layer 110, the light extraction pattern 112 may be nonuniform due to a nonuniform crystal structure. That is, a plane may exist on at least one portion of a top surface of the first conductive type semiconductor layer 110, and thus, light losses may occur. Accordingly, in the current embodiment, the second light extraction pattern 192 may be disposed on one surface of the volume layer 190 disposed on the first conductive type semiconductor layer 110 to minimize the light losses. That is, the light extraction pattern 112 and the second light extraction pattern 192 may be doubly disposed to maximize the light emitting efficiency.

The volume layer 190 may have a thickness of about 1 μm to about 200 μm. When a thickness T1 of the volume layer is less than about 1 μm, it may be difficult to effectively extract light in a lateral direction. Also, due to the thin thickness of the volume layer 190, it may be difficult to form the second light extraction pattern 192 on the top surface of the volume layer 190. Also, when the thickness T1 of the volume layer 190 is increased, a thickness of the conductive support substrate 175 should be decreased. In general, the more the thickness of the conductive support substrate 175 is increased, the more the light emitting efficiency may be improved. In consideration of the above-described conditions, the volume layer 180 may have a thickness T1 of about 200 μm or less to form the conductive support substrate 175 having an adequate thickness.

Figure 17:
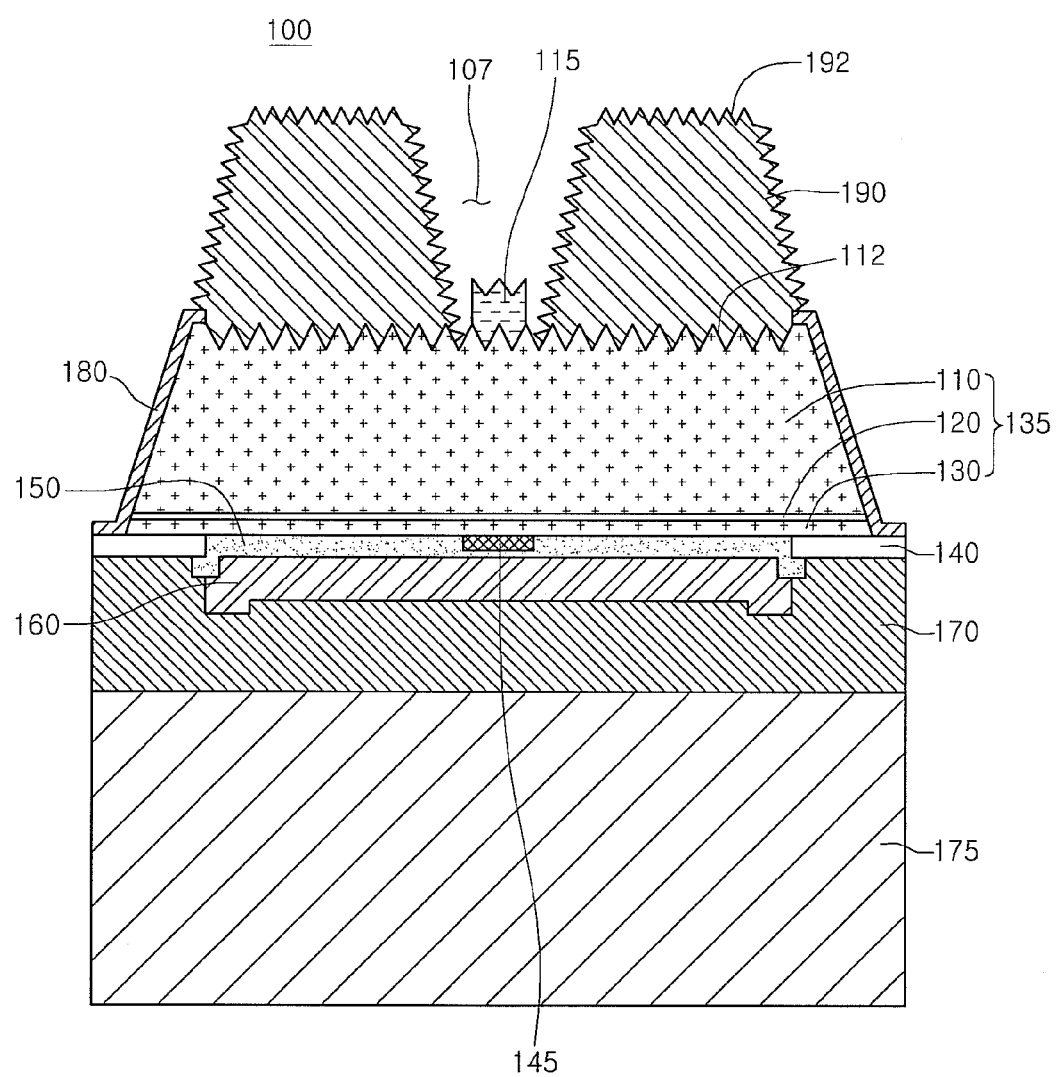
FIG. 17 is a sectional view illustrating another modified example of a light emitting device according to an embodiment.

According to an embodiment, as shown in FIG. 17, a roughness or uneven pattern may be disposed on a side surface of the volume layer 190. Thus, the more amount of light may be extracted in a lateral direction of the volume layer 190.

The electrode 115 may be disposed on the first conductive type semiconductor layer 110 to be spaced from an area in which the volume layer 190 is disposed. According to an embodiment, a hole 107 passing through the volume layer 190 and exposing a portion (i.e., a portion of the top surface) of the first conductive type semiconductor layer 110 may be defined. Here, the electrode 115 may be disposed within the hole 107.

The electrode 115 may have a width W1 equal to a width W2 of the hole 107. Alternatively, in consideration of a process margin, the electrode 115 may have a width W1 less than a width W2 of the hole 107. The hole 107 may have a width of about several μm to several hundred μm. As shown in FIG. 1, the hole 107 may have the uniform width in the volume layer 190. Also, a width of the hole 107 may be varied according to a height thereof. For example, when the hole 107 is adjacent to the first conductive type semiconductor layer 110, the width of the hole 107 may be decreased.

The electrode 115 may have a thickness T2 of about 0.5 nm to about 50 nm. The thickness T2 of the electrode 115 may be determined so that light generated in the light emitting structure layer 135 is adequately supplied into the light emitting structure layer 135 without being absorbed by the electrode 115.

The electrode 115 may be formed of at least one of Au, Pd, Pt, Ru, Re, Mg, Zn, Hf, Ta, Rh, Ir, W, Ti, Ag, Cr, Mo, Nb, Al, Ni, Cu, WTi, V, and alloys thereof.

For example, the electrode 115 may comprise an ohmic layer contacting the light emitting structure layer 135 to ohmic-contact the light emitting structure layer 135 and an electrode layer disposed on the ohmic layer. For example, the ohmic layer may be formed of Cr, Al, V, or Ti. The electrode layer may comprise a barrier layer formed of Ni or Al, a metal layer formed of Cu, a barrier formed of Ni or Al, and a wire bonding layer formed of Au, which are sequentially stacked. However, the current embodiment is not limited thereto. For example, the electrode layer may be realized as a single layer such as a W layer, a WTi layer, a Ti layer, an Al layer, or an Ag layer.

Since the light extraction pattern 112 is disposed on the top surface of the first conductive type semiconductor layer 110, a pattern corresponding to the light extraction pattern 112 may be smoothly disposed on a bottom surface of the electrode 115 through the manufacturing process. However, the present disclosure is not limited thereto. Also, the pattern corresponding to the light extraction pattern 112 may be disposed on a top surface of the light emitting structure layer 115.

The volume layer 190 may be disposed on the light emitting structure layer 135, and a passivation layer 180 may be disposed on a portion on which the electrode 115 is not disposed. That is, the passivation layer 180 may be disposed on the top and side surfaces of the first conductive type semiconductor layer 110 and a top surface of the protection member 140, but is not limited thereto.

Hereinafter, a method of fabricating the light emitting device 100 according to an embodiment will be described with reference to FIGS. 2 to 14. However, duplicate descriptions, which have been described already in the previous exemplary embodiments, will be omitted or described briefly.

FIGS. 2 to 14 are views illustrating a process of fabricating a light emitting device according to an embodiment.

Figure 2:
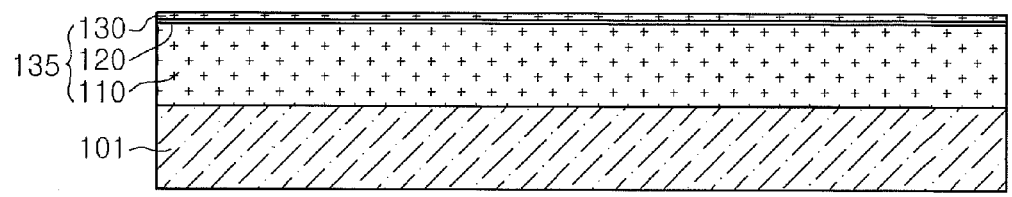
FIGS. 2 to 14 are views illustrating a process of fabricating a light emitting device according to an embodiment.

Referring to FIG. 2, a light emitting structure layer 135 may be formed on a growth substrate 101.

The growth substrate 101 may be formed of at least one of sapphire (Al2O3), Si, SiC, GaAs, GaN, ZnO, MgO, GaP, InP, and Ge. However, the present disclosure is not limited thereto. For example, the growth substrate 101 may be formed of various materials.

The light emitting structure layer 135 may be formed by successively growing a first conductive type semiconductor layer 110, an active layer 120, and a second conductive type semiconductor layer 130 on the growth substrate 101.

For example, the light emitting structure layer 135 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process. However, the present disclosure is not limited thereto.

A buffer layer and/or an undoped nitride layer for reducing a lattice constant between the light emitting structure layer 135 and the growth substrate 101 may be formed therebetween.

Figure 3:
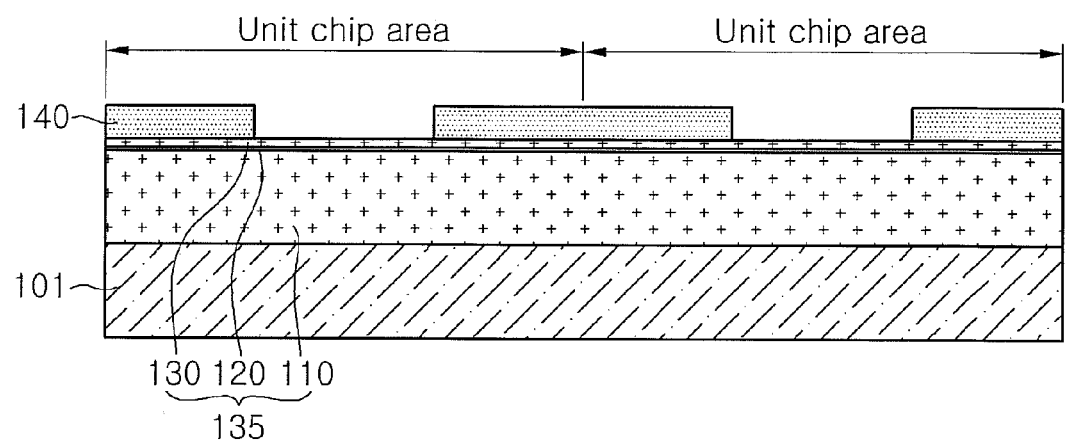

Sequentially, as shown in FIG. 3, a protection member 140 may be selectively formed on the light emitting structure layer 135 to correspond to a unit chip area. The protection member 140 may be formed around the unit chip area using a patterned mask. The protection member 140 may be formed using one of various deposition processes such as an E-beam deposition process, a sputtering process, and a plasma enhanced chemical vapor deposition (PECVD) process.

Figure 4:
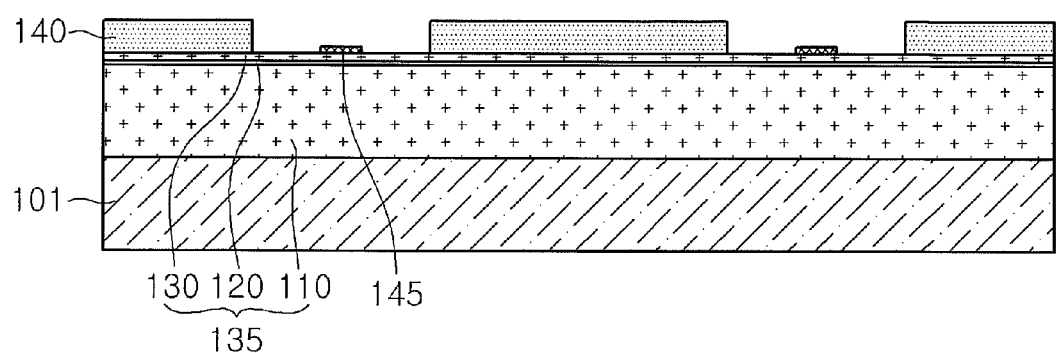

Referring to FIG. 4, a current blocking layer 145 may be formed on the second conductive type semiconductor layer 130. The current blocking layer 145 may be formed using a mask pattern.

Although the protection member 140 and the current blocking layer 145 are formed using separate processes in FIGS. 3 and 4, the protection member 140 and the current blocking layer 145 may be formed of the same material as each other and simultaneously formed using one process. For example, after a SiO2 layer is formed on the second conductive type semiconductor layer 130, the protection member 140 and the current blocking layer 145 may be simultaneously formed using a mask pattern.

Figure 5:
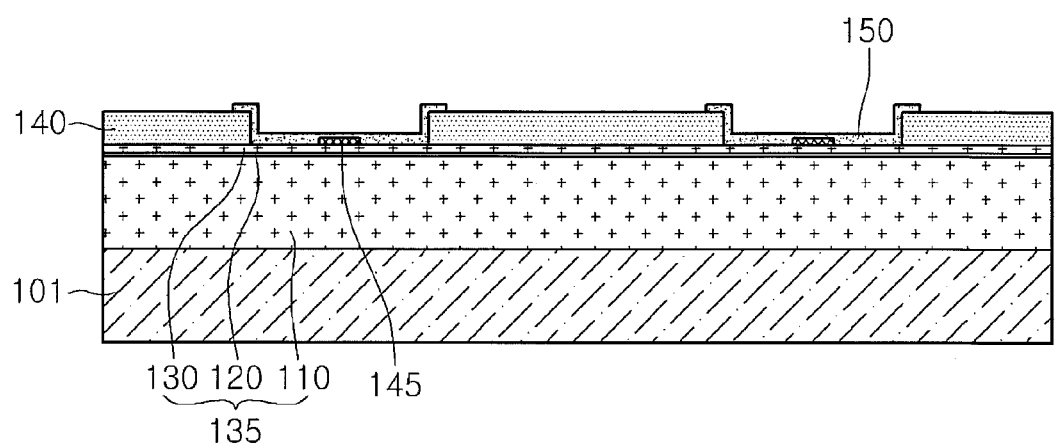
Figure 6:
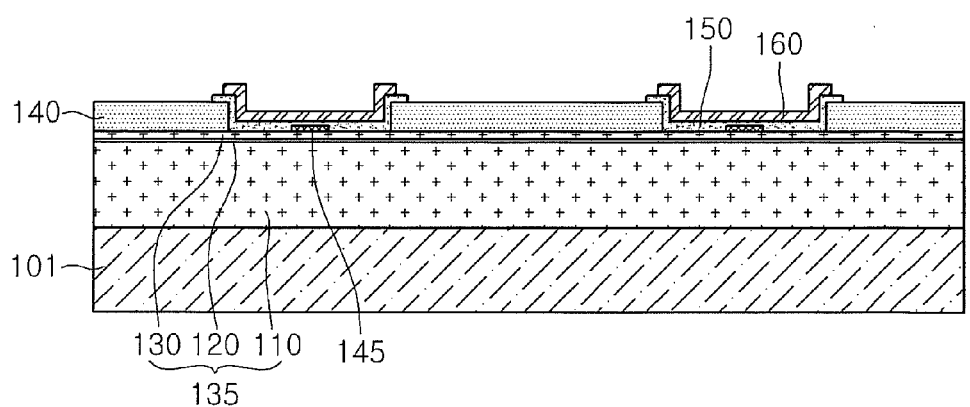

Referring to FIGS. 5 and 6, an ohmic layer 150 and a reflective layer 160 may be successively formed on the second conductive type semiconductor layer 130 and the current blocking layer 145.

For example, the ohmic layer 150 and the reflective layer 160 may be formed using one of an E-beam deposition process, a sputtering process, and a PECVD process.

Figure 7:
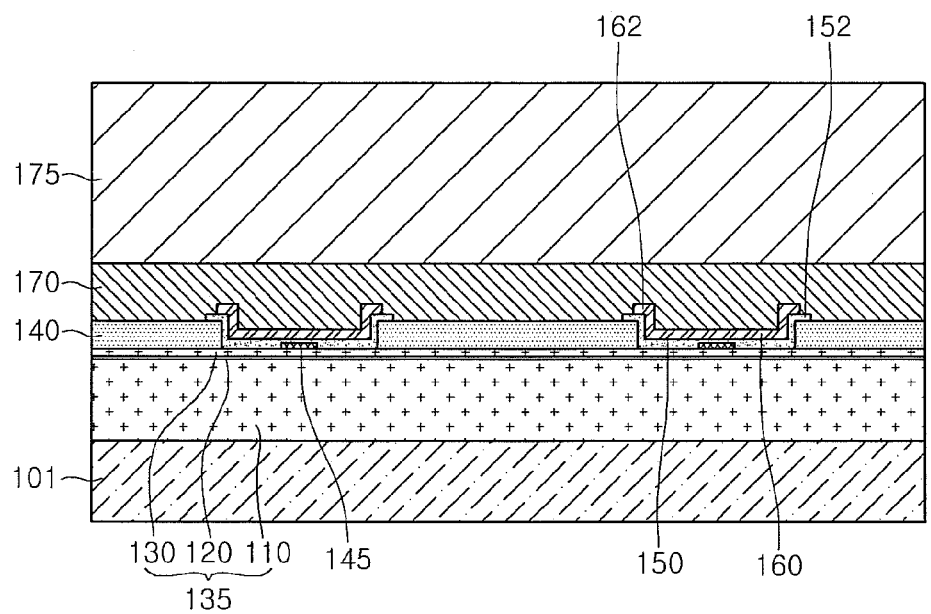

Referring to FIG. 7, a conductive support substrate 175 may adhere to a structure of FIG. 6 using an adhesion layer 1670 as a medium. The adhesion layer 170 may contact the reflective layer 160, an end of the ohmic layer 150, and the protection member 140 to enhance an adhesion between the reflective layer 160, the ohmic layer 150, and the protection member 140.

In the above-described embodiment, although the conductive support substrate 175 is coupled using the adhesion layer 170 through the bonding process, the conductive support substrate 175 may be coupled through a plating process or a deposition process without forming the adhesion layer 170.

Figure 8:
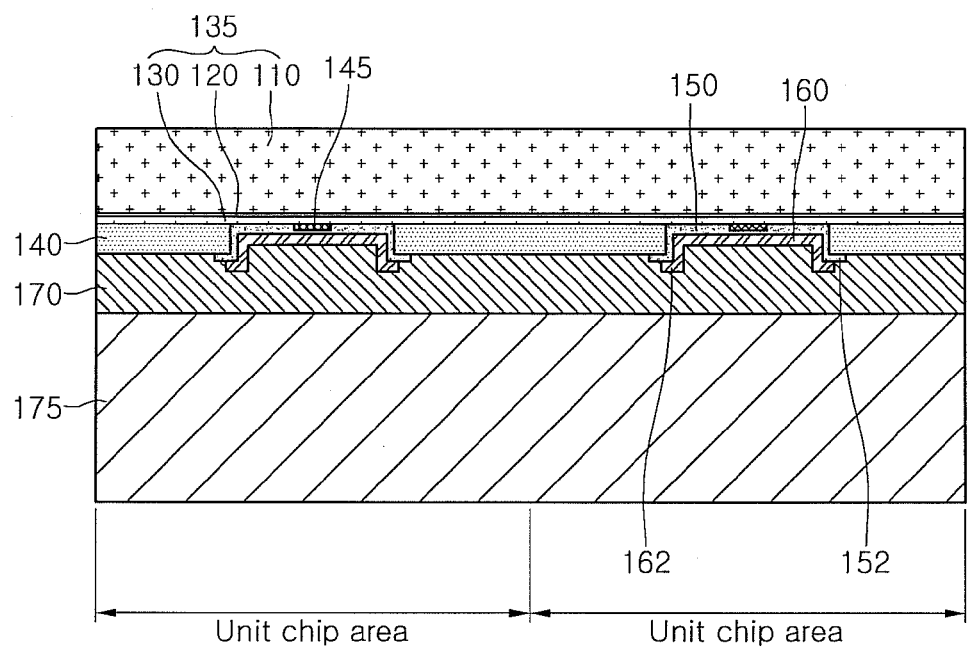

Referring to FIG. 8, the growth substrate 101 may be removed from the light emitting structure layer 135. FIG. 8 illustrates a shape in which the structure of FIG. 7 is turned over.

The growth substrate 101 may be removed using a laser lift off process or a chemical lift off process.

Figure 9:
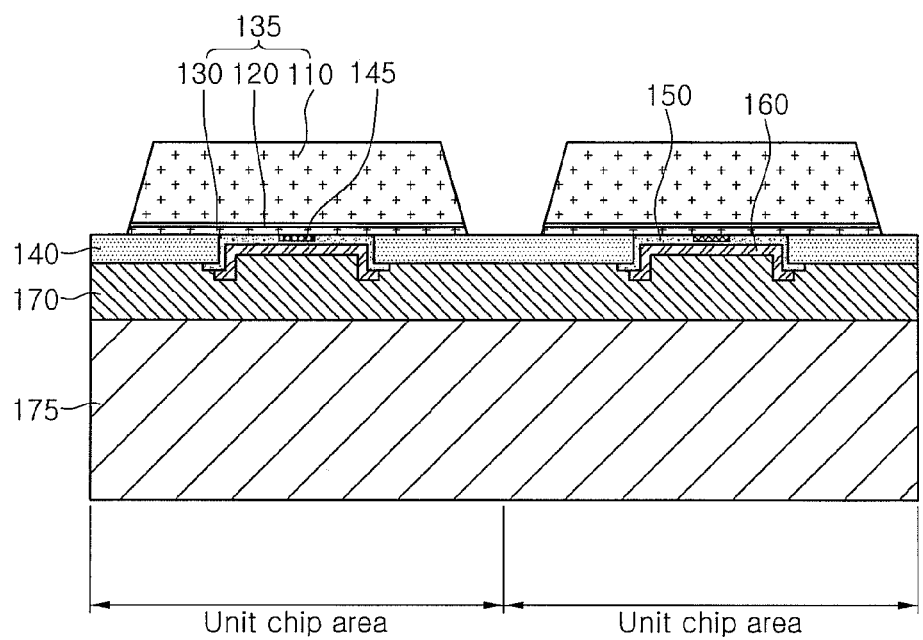

Referring to FIG. 9, an isolation etching process may be performed on the light emitting structure layer 135 along a unit chip area to divide the light emitting structure layer 135 into a plurality of light emitting structure layers 135. For example, the isolation etching process may be performed through a dry etching process such as an inductively coupled plasma (ICP) process.

Figure 10:
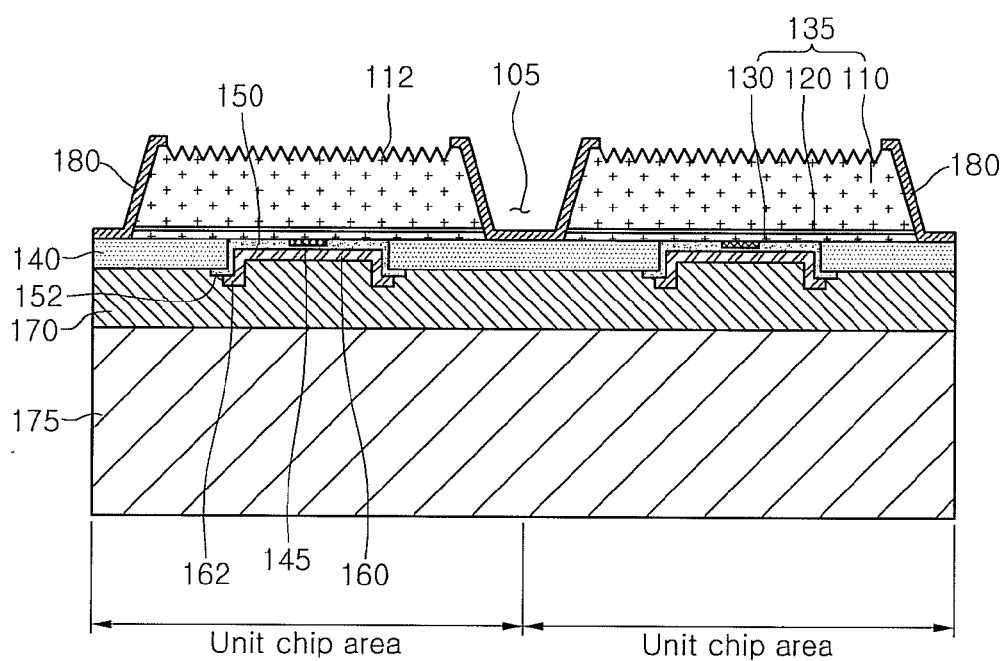

Referring to FIG. 10, a passivation layer 180 may be formed on the protection member 140 and the light emitting structure layer 135. Then, the passivation layer 180 may be selectively removed to expose a top surface of the first conductive type semiconductor layer 110. A light extraction pattern 112 may be formed on the top surface of the first conductive type semiconductor layer 110 to improve light extraction efficiency. The light extraction pattern 112 may be formed through a wet etching process or a dry etching process.

Figure 11:
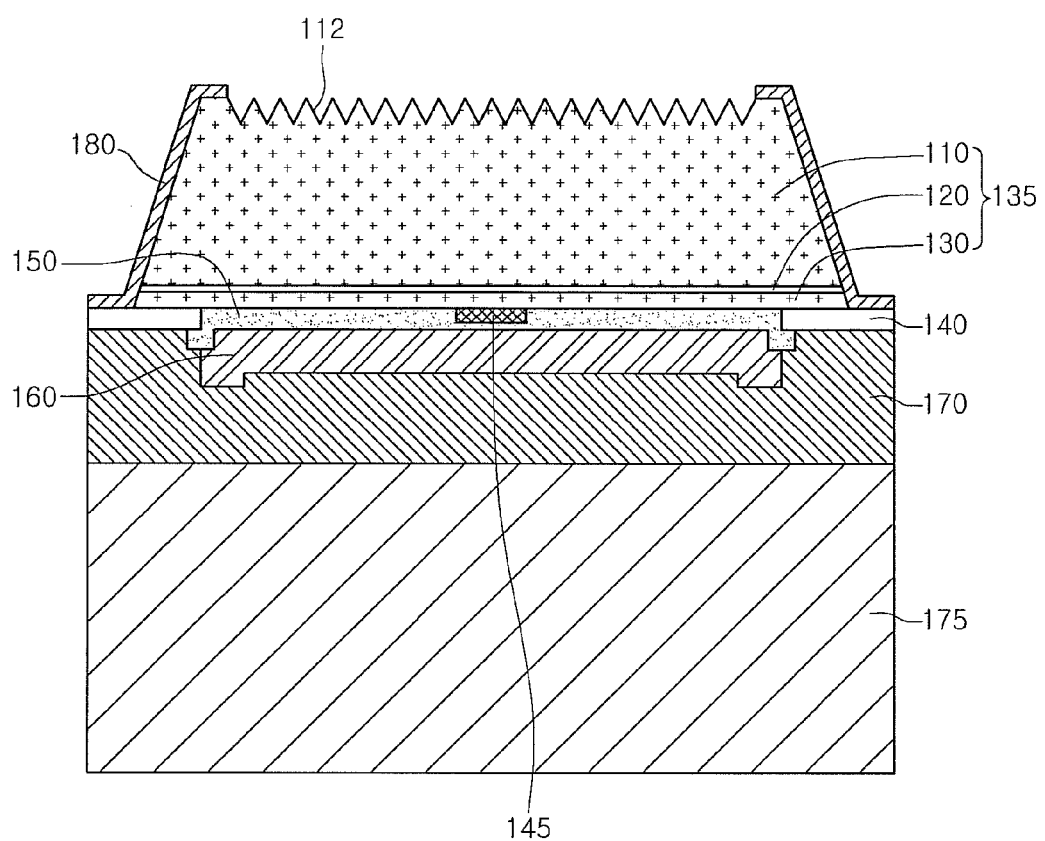

Referring to FIG. 11, a chip separation process may be performed on the structure of FIG. 10 to divide the structure into unit chip areas, thereby fabricating a plurality of light emitting devices.

For example, the chip separation process may comprise a breaking process in which a physical force is applied using a blade to separate a chip, a laser scribing process in which a laser is radiated into a chip boundary to separate a chip, and an etching process comprising a wet or dry etching process. However, the present disclosure is not limited thereto.

Figure 12:
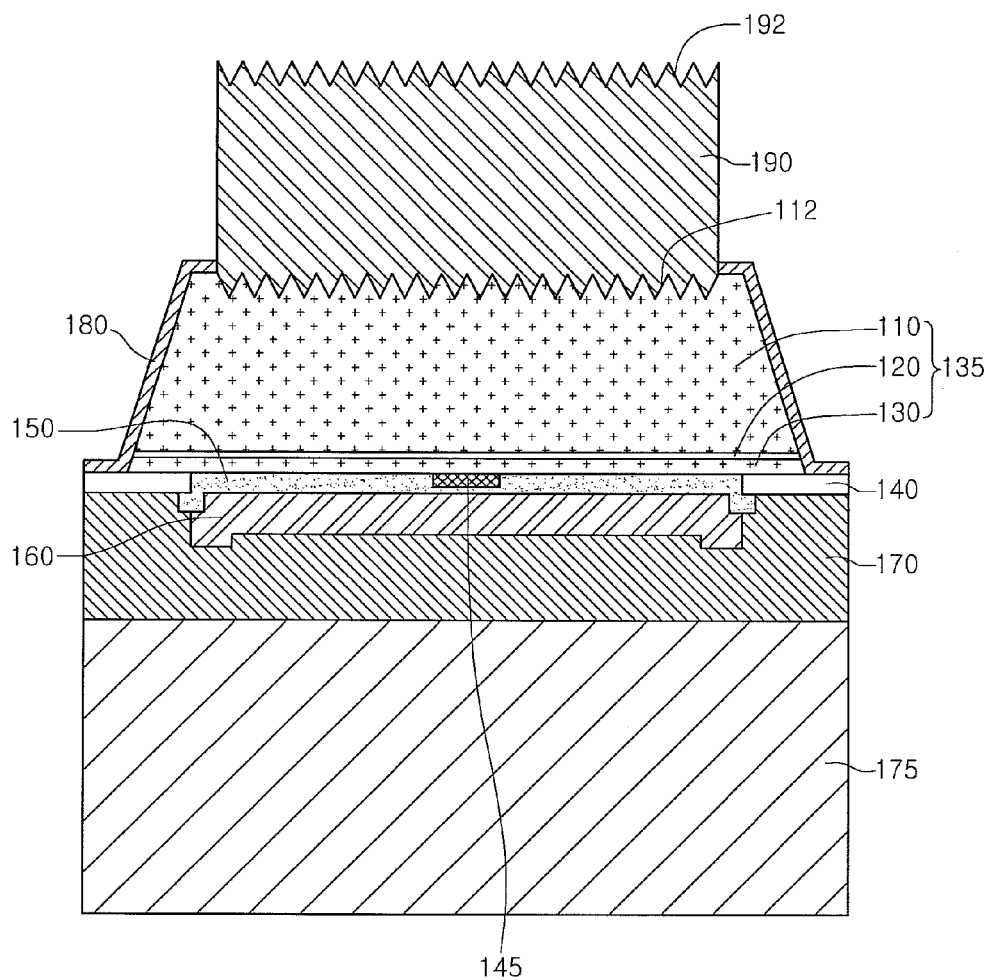

Referring to FIG. 12, a volume layer 190 may be formed on the top surface of the light emitting structure layer 135 on which the passivation layer 180 is not formed. The volume layer 190 may be formed using an E-beam deposition process, a sputtering process, an atomic layer deposition (ALD) process, a CVD process, a PECVD process or an ALD process.

A second light extraction pattern 192 may be formed on a top surface of the volume layer 190 to improve light extraction efficiency. The second light extraction pattern 192 may be formed through a wet etching process or a dry etching process.

Figure 13:
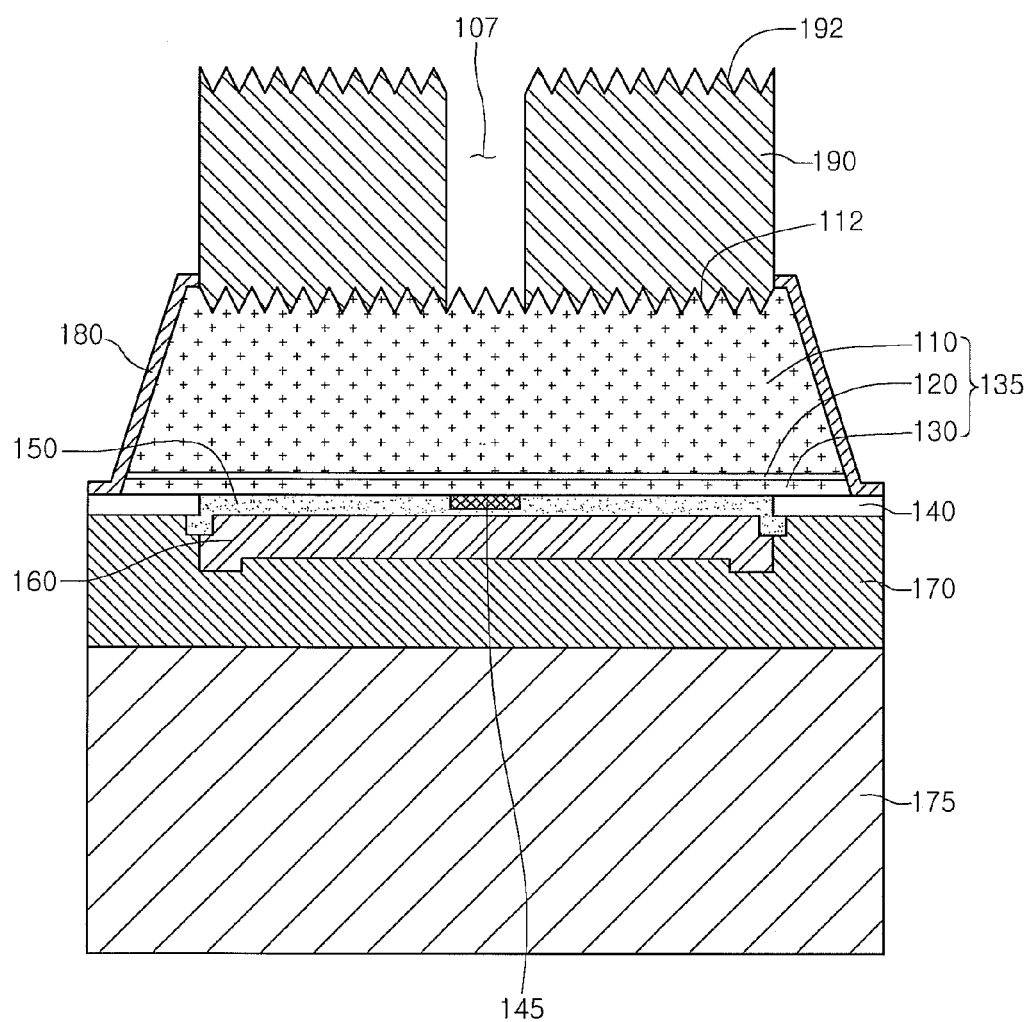

Referring to FIG. 13, a hole 107 may be formed to pass through a portion of the volume layer 190.

For example, a dry etching process using an inductively coupled plasma (ICP) equipment or a wet etching process using an etchant such as KOH, $H_2SO_4$, or $H_3PO_4$ may be performed to form the hole 107, but is not limited thereto.

Figure 14:
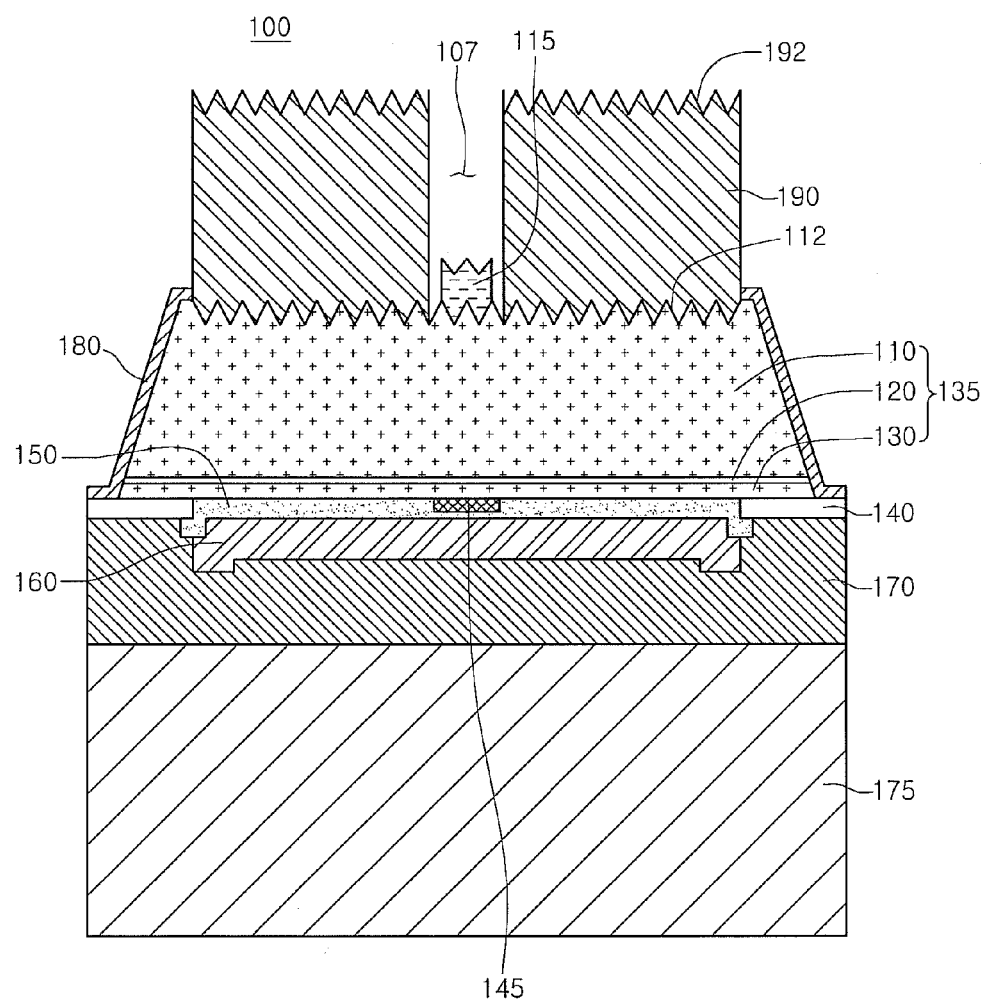

Referring to FIG. 14, an electrode 115 may be formed on the top surface of the first conductive type semiconductor layer 110 exposed by the hole 107. The electrode 115 may be formed using a sputtering process or an E-beam deposition process.

As described above, the chip separation process is performed, and then, the volume layer 190 and the electrode 115 are formed. However, the present disclosure is not limited thereto. For example, the volume layer 190 and the electrode may be formed, and then, the chip separation process may be performed. The process of fabricating the light emitting device according to an embodiment is not limited thereto. For example, a specific process may be variously modified according to a design.

Hereinafter, a light emitting device according modified examples and a process of fabricating the same will be described with reference to FIGS. 15, 16, 18, and 19.

Figure 15:
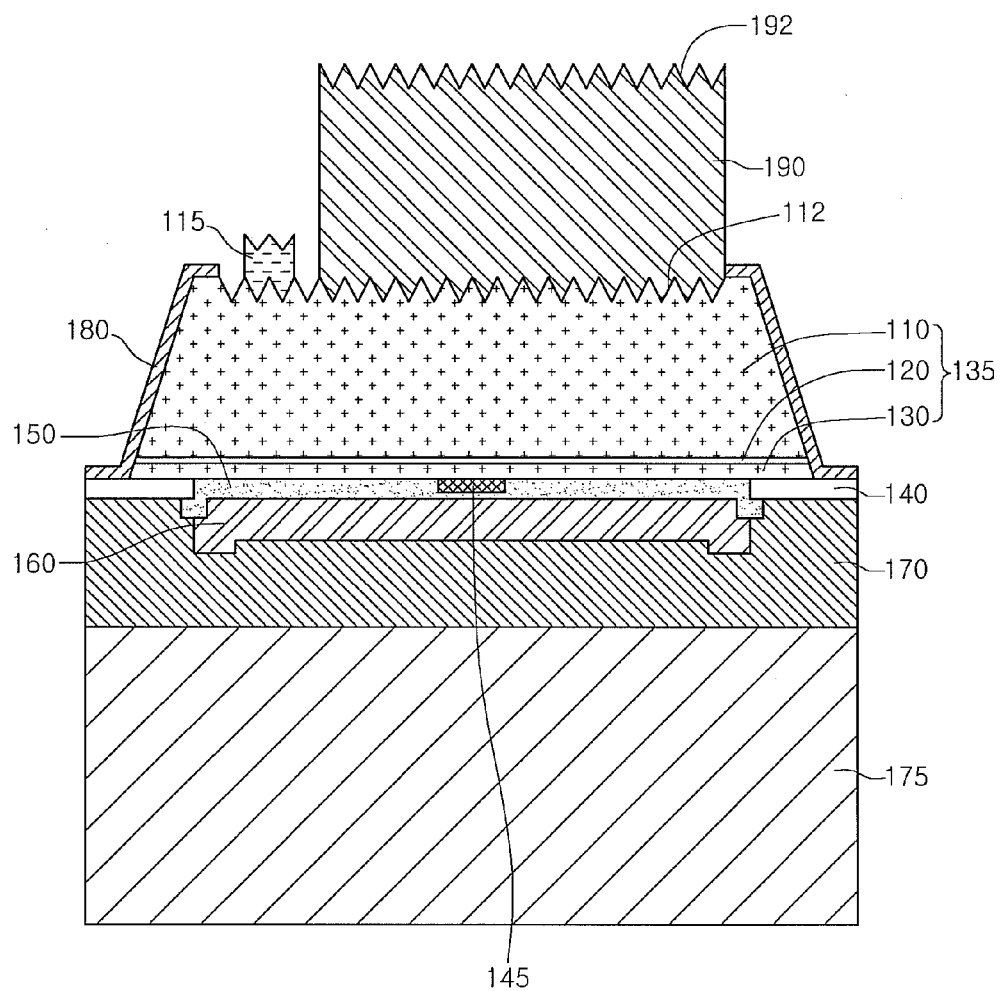
FIG. 15 is a sectional view illustrating a modified example of a light emitting device according to an embodiment.

FIG. 15 is a sectional view illustrating a modified example of a light emitting device according to another embodiment.

Referring to FIG. 15, in the current modified example, an electrode 115 is disposed outside a volume layer 190 on a top surface of a first conductive type semiconductor layer 110. Thus, a process for defining a separate hole (reference numeral 107 of FIG. 14) passing through the volume layer 190 may be omitted. Thus, the fabricating process may be simplified.

The light emitting device according the current modified example may be fabricated by a process similar to those of FIGS. 2 to 12 and 14 except the process for defining the hole. Here, the electrode 115 may be formed first on the first conductive type semiconductor layer 110, and then the volume layer 190 may be formed.

Figure 18:
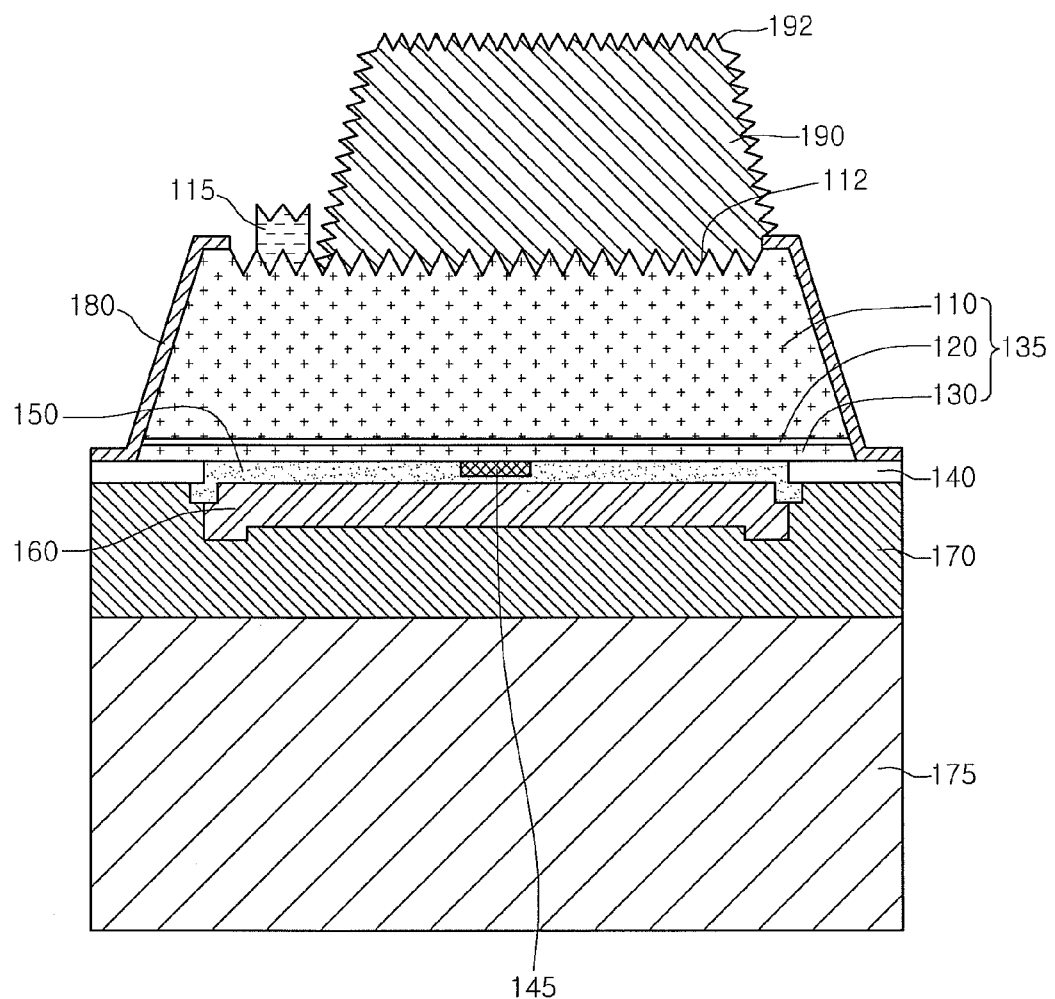
FIG. 18 is a sectional view illustrating another modified example of a light emitting device according to an embodiment.

According to an embodiment, as shown in FIG. 18, a roughness or uneven pattern may be disposed on a side surface of the volume layer 190. Thus, the more amount of light may be extracted in a lateral direction of the volume layer 190.

Figure 16:
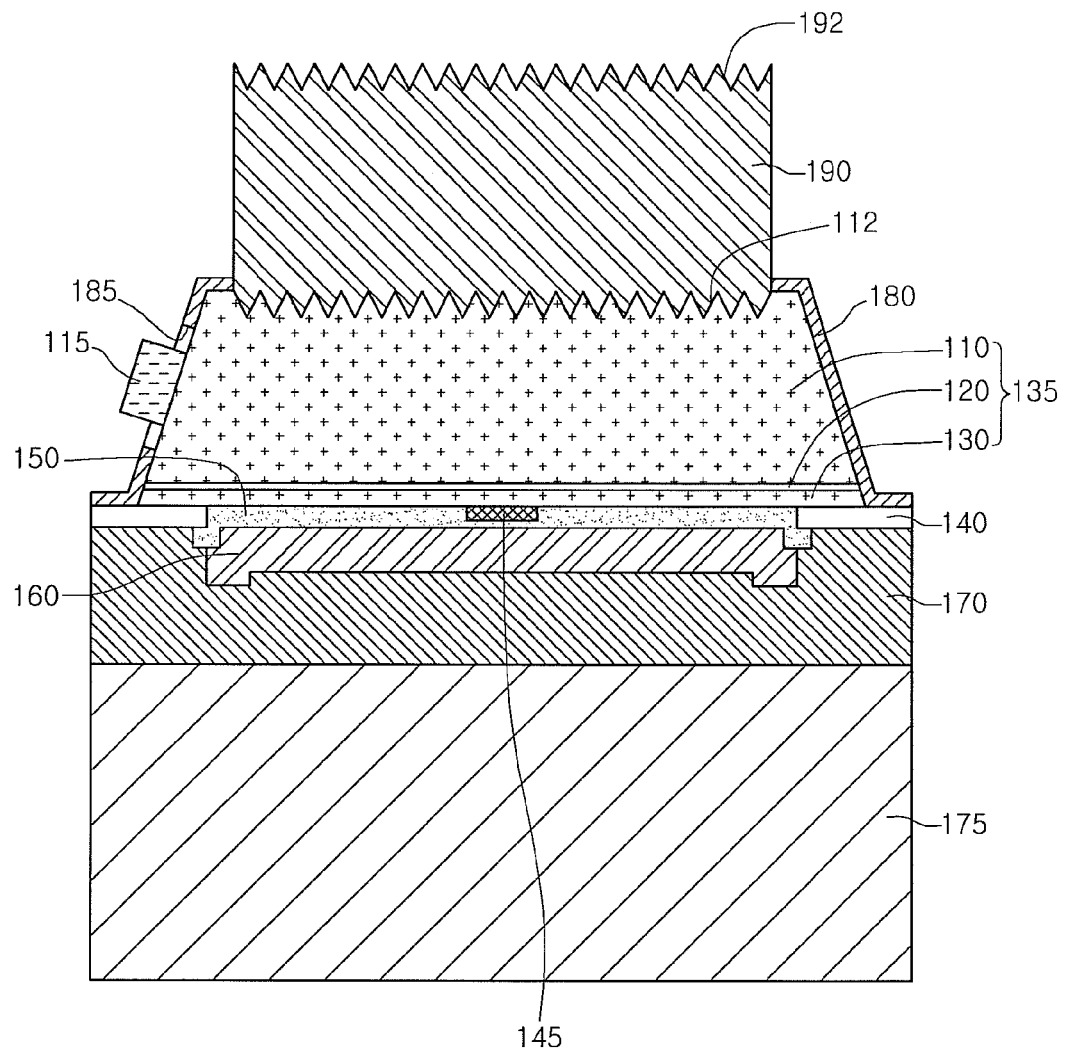
FIG. 16 is a sectional view illustrating another modified example of a light emitting device according to an embodiment.

FIG. 16 is a sectional view illustrating another modified example of a light emitting device according to an embodiment.

Referring to FIG. 16, in the current modified example, an electrode 115 may be disposed outside a volume layer 190 on a top surface of a first conductive type semiconductor layer 110, i.e., a side surface of the first conductive type semiconductor layer 110.

In the light emitting device according to the current modified example, the process of FIGS. 2 to 12 may be performed, and then an opening 185 may be defined in an area of a passivation layer 180 covering the side surface of the first conductive type semiconductor layer 110. Thereafter, an electrode 115 may be disposed within the opening 185.

In the drawings, although the electrode 115 is disposed on only the side surface of the first conductive type semiconductor layer 110, the electrode 115 may extend from a top surface of the first conductive type semiconductor layer 110 up to the side surface.

Figure 19:
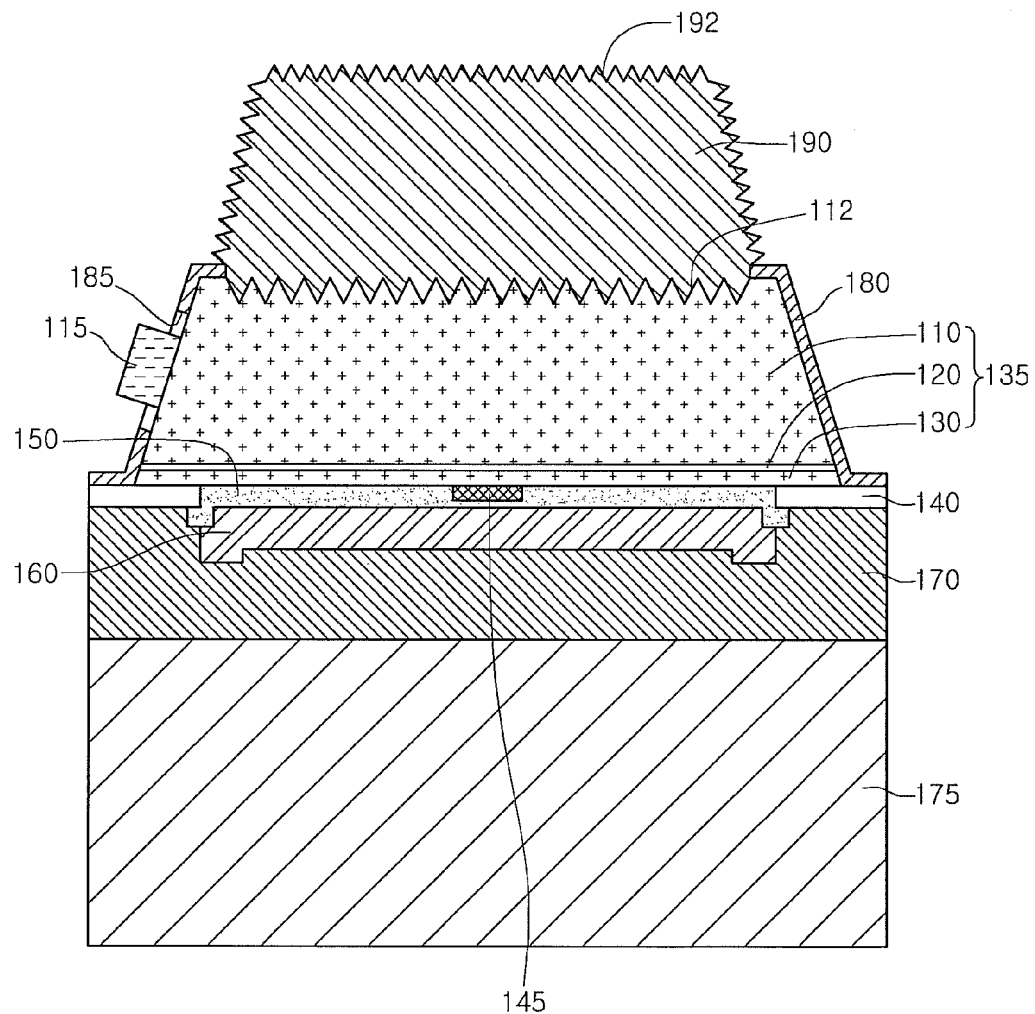
FIG. 19 is a sectional view illustrating a modified example of a light emitting device according to another embodiment.

According to an embodiment, as shown in FIG. 19, a roughness or uneven pattern may be disposed on a side surface of the volume layer 190. Thus, the more amount of light may be extracted in a lateral direction of the volume layer 190.

Figure 20:
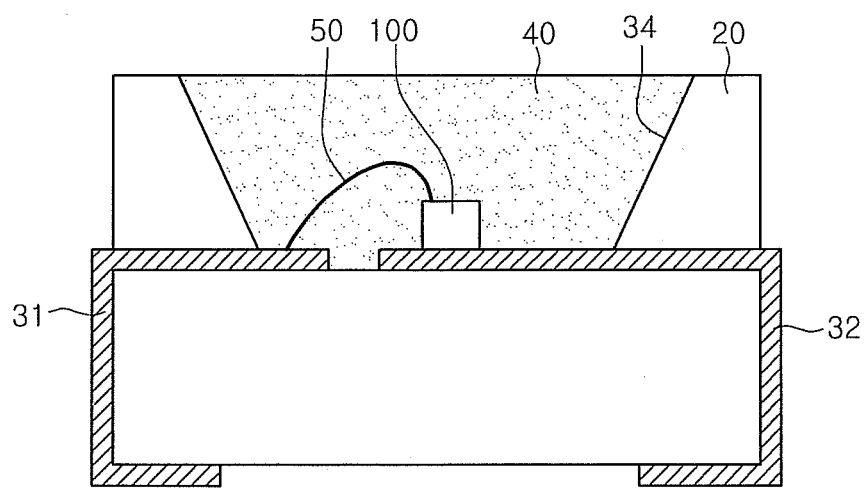
FIG. 20 is a sectional view of a light emitting device package comprising the light emitting device according to an embodiment.

Hereinafter, a light emitting device package comprising the light emitting device according to the current embodiment will be described with reference to FIG. 20. FIG. 20 is a sectional view of a light emitting device package comprising the light emitting device according to an embodiment.

Referring to FIG. 20, a light emitting device package according to an embodiment comprises a package body 20, a first and a second electrode layers 31 and 32 disposed on the package body 20, a light emitting device 100 disposed on the package body 20 and electrically connected to the first and second electrode layers 31 and 32, and a molding member 40 surrounding the light emitting device 100.

The package body 20 may be formed of a resin such as polyphthal amide (PPA), liquid crystal polymer (LCP), polyamid9T (PA9T), a metal, a photo sensitive glass, $Al_2O_3$, ceramic, or a printed circuit board (PCB). However, the present disclosure is not limited to the above-described materials.

A recess 34 having an opened upper side may be defined in the package body 20. The recess 34 may have a side surface perpendicular or inclined with respect to a bottom surface thereof.

The first and second electrode layers 31 and 32 electrically connected to the light emitting device 100 are disposed on the package body 20. Each of the first and second electrode layers 31 and 32 may be formed of a metal plate having a predetermined thickness. The other metal layer may be plated on surfaces of the first and second electrode layers 31 and 32. Each of the first and second electrode layers 31 and 32 may be formed of a metal having superior conductivity. For example, examples of the metal having the superior conductivity may comprise Ti, Cu, Ni, Au, Cr, Ta, Pt, Sn, and Ag.

The first and second electrode layers 31 and 32 supply a power to the light emitting device 100. Also, the first and second electrode layers 31 and 32 may reflect light generated in the light emitting device 100 to improve light efficiency. In addition, the first and second electrode layers 31 and 32 may release heat generated in the light emitting device 100 to the outside.

The light emitting device 100 electrically connected to the first and second electrode layers 31 and 32 is disposed within the recess 34. The light emitting device 100 may be electrically connected to the first and second electrode layers 31 and 32 through one of a wiring process, a flip-chip process, and a die bonding process. According to the current embodiment, the light emitting device 100 may be electrically connected to the first electrode layer 31 through a wire 50. Also, the light emitting device 100 may directly contact the second electrode layer 32 and be electrically connected to the second electrode layer 32.

The molding member 40 may surround the light emitting device 100 to protect the light emitting device 100. Also, the molding member 40 may comprise a phosphor to vary a wavelength of light emitted form the light emitting device 100.

As described above, the molding member 40 may have a refractive index less than that of the volume layer (see reference numeral 190 of FIG. 1, ditto) of the light emitting device 100 to further improve light extraction efficiency.

The light emitting device package according to the above embodiments and modified examples may be applied to lighting systems such as a backlight unit, an indicating device, a lamp, and a road lamp. This will be described with reference to FIGS. 21 and 22.

Figure 21:
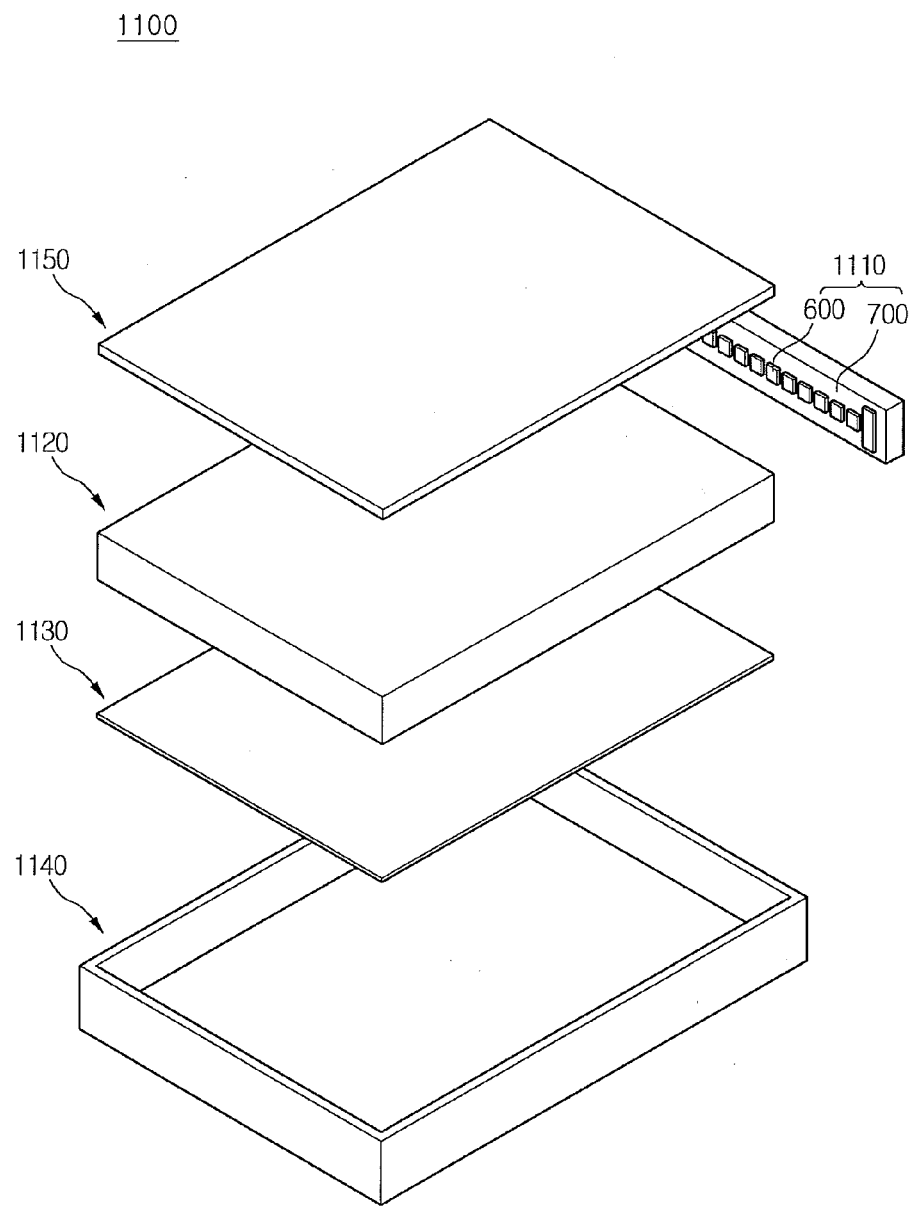
FIG. 21 is a perspective view illustrating a backlight unit comprising a light emitting device according to an embodiment.

FIG. 21 is a perspective view illustrating a backlight unit comprising a light emitting device according to an embodiment. A backlight unit 1100 of FIG. 21 is just an example of a lighting system, and thus, the present disclosure is not limited thereto.

Referring to FIG. 21, the backlight unit 1100 may comprise a bottom cover 1140, a light guide member 1120 disposed within the bottom cover 1140, and a light emitting module 1110 on at least one surface or lower surface of the light guide member 1120. A reflective sheet 1130 may be disposed under the light guide member 1120.

The bottom cover 1140 may have a box shape with an opened top surface to receive the light guide member 1120, the light emitting module 1110, and the reflective sheet 1130. Also, the bottom cover may be formed of a metal or resin. However, the present disclosure is not limited thereto.

The light emitting module 1110 may comprise a plurality of light emitting device packages 600 installed on a board 700. The light emitting device packages 600 may provide light to the light guide member 1120.

As shown in FIG. 21, the light emitting module 1110 may be disposed on at least one of inner surfaces of the bottom frame 1140. Thus, the light emitting module 1110 may provide light toward at least one side surface of the light guide member 1120.

However, the light emitting module 1110 may be disposed under the light guide member 1120 within the bottom cover 1140 to provide light to the bottom surface of the light guide member 1120. That is the light emitting module 1110 may be variously changed in position according to a design of the backlight unit 1100.

The light guide member 1120 may be disposed within the bottom cover 1140. The light guide member 1120 may receive the light provided from the light emitting module 1110 to produce planar light, thereby guiding the planar light to a display panel.

For example, the light guide member 1120 may be a light guide panel (LGP). For example, the light guide member 1120 may be formed of one of acrylic resin such as polymethyl metaacrylate (PMMA), polyethylene terephthalate (PET), cycloolefin copolymer (COC), poly carbonate (PC), and polyethylene naphthalate resin.

An optical sheet 1150 may be disposed above the light guide member 1120.

For example, the optical sheet 1150 may comprise at least one of a diffusion sheet, a light collecting sheet, a brightness enhancement sheet, and a fluorescent sheet. For example, the optical sheet 1150 may be formed by stacking a diffusion sheet, a light collecting sheet, a brightness enhancement sheet, and a fluorescent sheet. The diffusion sheet may uniformly diffuse light emitted from the light emitting module 1110. The diffused light may be collected into the display panel by the light collecting sheet. Here, light emitted from the light collecting sheet is randomly polarized light. The brightness enhancement sheet may increase a polarization degree of light emitted from the light collecting sheet. For example, the light collecting sheet may be horizontal and/or vertical prism sheet(s). For example, the brightness enhancement sheet may be a dual brightness enhancement film. Also, the fluorescent sheet may be a light transmitting plate or film including a phosphor.

The reflective sheet 1130 may be disposed under the light guide member 1120. The reflective sheet 1130 may reflect light emitted through the bottom surface of the light guide member 1120 toward a light emitting surface of the light guide member 1120. The reflective sheet 1130 may be formed of a resin, e.g., a PET resin, a PC resin, and a poly vinyl chloride resin, but is not limited thereto.

Figure 22:
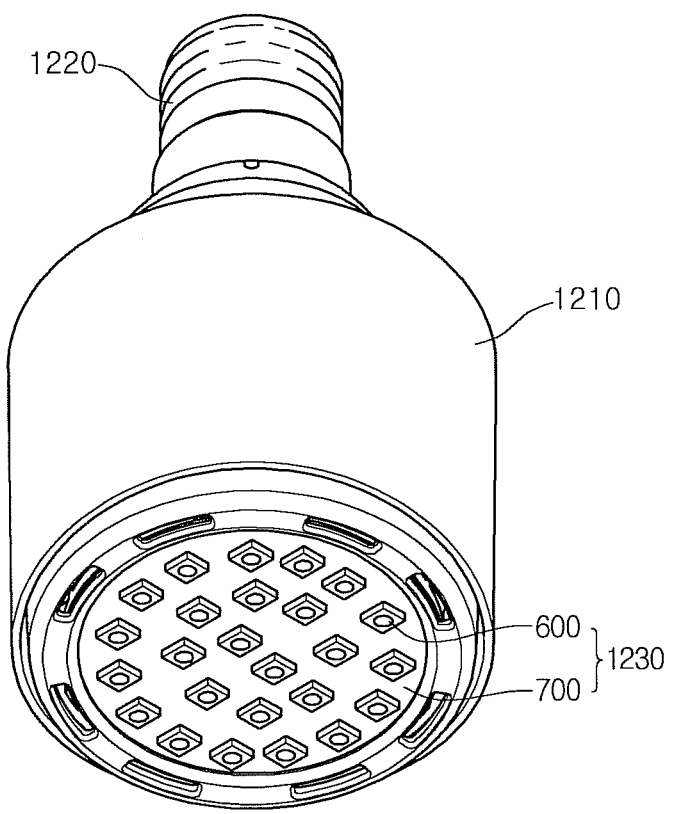
FIG. 22 is a view of a lighting unit comprising the light emitting device package according to an embodiment.

FIG. 22 is a view of a lighting unit including the light emitting device package according to an embodiment. However, a lighting unit 1200 of FIG. 22 is described as an example of the lighting system. Thus, the present disclosure is not limited thereto.

Referring to FIG. 22, the lighting unit 1200 may comprise a case body 1210, a light emitting module 1230 disposed on the case body 1210, and a connection terminal 1220 disposed on the case body 1210 to receive a power from an external power source.

The case body 1210 may be formed of a material having a good heat dissipation characteristic. For example, the case body 1210 may be formed of a metal or resin.

The light emitting module 1230 may comprise a board 700 and at least one light emitting device package 600 mounted on the board 700.

A circuit pattern may be printed on an insulation material to form the board 700. For example, the board 700 may comprise a printed circuit board (PCB), a metal core PCB, a flexible PCB, or a ceramic PCB.

Also, the board 700 may be formed of a material that can effectively reflect light. Alternatively, a surface of the board 700 may be coated with a color material, e.g., a white or silver-colored material by which light is effectively reflected.

At least one light emitting device package 600 may be mounted on the board 700.

Each of the light emitting device packages 600 may at least one light emitting device. The light emitting device may comprise a colored light emitting device that emits red, green, blue, or white light, and an UV light emitting device that emits ultraviolet (UV) light.

The light emitting module 1230 may have various combinations of light emitting devices to obtain intended colors and brightness. For example, a white light emitting device, a red light emitting device, and a green light emitting device may be disposed in combination with each other to secure a high color rendering index (CRI). A fluorescent sheet may be disposed in a path of light emitted from the light emitting module 1230. The fluorescent sheet may change a wavelength of the light emitted from the light emitting module 1230. For example, when the light emitted from the light emitting module 1230 has a blue wavelength, a yellow phosphor may be contained in the fluorescent sheet. Here, the blue light emitted from the light emitting module 1230 may pass through the fluorescent sheet to realize yellow light. Finally, the blue light and the yellow light may be mixed with each other to realize white light.

The connection terminal 1220 may be electrically connected to the light emitting module 1230 to provide a power to the light emitting module 1230. Referring to FIG. 22, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain desired optical effects.

As described above, since the lighting system comprises the light emitting device package having the superior efficiency, the lighting system may have superior light efficiency and characteristic.

The light emitting device, the light emitting device package, and the light unit according to the embodiments may have the improved light extraction efficiency and the wide orientation angle.

Features, features, structures and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a support substrate;
a light emitting structure layer disposed on the support substrate, the light emitting structure layer comprising a first conductive type semiconductor layer, a second conductive type semiconductor layer, and an active layer disposed between the first conductive type semiconductor layer and the second conductive type semiconductor layer;
an electrode electrically connected to the first conductive type semiconductor layer;
a volume layer disposed on the light emitting structure layer, the volume layer having a thickness greater than a thickness of the electrode; and
a passivation layer disposed on a side surface and a top surface of the light emitting structure layer,
wherein a top surface of the volume layer is disposed higher than a top surface of the passivation layer.

2. The light emitting device according to claim 1, wherein the volume layer has a thickness of about 1 um to about 20 um.

3. The light emitting device according to claim 1, wherein the volume layer is formed of at least one material of $SiO_2$, $SiO_x$, $SiO_xN_y$, $Si_3N_4$, $TiO_2$, and $Al_2O_3$.

4. The light emitting device according to claim 1, wherein the volume layer is disposed on the first conductive type semiconductor layer, and the electrode is spaced from an area on which the volume layer is not disposed on the first conductive type semiconductor layer, and
wherein the top surface of the volume layer is disposed higher than a top surface of the electrode.

5. The light emitting device according to claim 4, wherein the volume layer has a hole exposing a portion of the first conductive type semiconductor layer, and the electrode is disposed within the hole.

6. The light emitting device according to claim 4, wherein the electrode is disposed outside the volume layer, and wherein the electrode is disposed on a top surface of the first conductive type semiconductor layer.

7. The light emitting device according to claim 1, wherein at least one portion of the electrode is disposed on a side surface of the first conductive type semiconductor layer.

8. The light emitting device according to claim 1, wherein a light extraction pattern is disposed on one surface of the volume layer.

9. The light emitting device according to claim 1, wherein the light emitting structure layer has a top surface with a light extraction pattern.

10. The light emitting device according to claim 1, wherein a roughness is disposed on a side surface of the volume layer.

11. The light emitting device according to claim 1, further comprising
a current blocking layer disposed between the support substrate and the light emitting structure layer, wherein at least one portion of the current blocking layer vertically overlaps the electrode.

12. The lighting emitting device according to claim 1, wherein the volume layer is formed of a material having a refractive index less than that of the material for forming the light emitting structure layer.

13. The light emitting device according to claim 1, further comprising a reflective electrode disposed under the light emitting structure layer, the reflective electrode being electrically connected to the second conductive type semiconductor layer.

14. A light emitting device package comprising:
a body;
a light emitting device disposed on the body; and
a first and a second electrode layers electrically connected to the light emitting device,
wherein the light emitting device comprises: a support substrate;
a light emitting structure layer disposed on the support substrate, the light emitting structure layer comprising a first conductive type semiconductor layer, a second conductive type semiconductor layer, and an active layer disposed between the first conductive type semiconductor layer and the second conductive type semiconductor layer;
an electrode electrically connected to the first conductive type semiconductor layer;
a volume layer disposed on the light emitting structure layer, the volume layer having a thickness greater than a thickness of the electrode; and
a passivation layer disposed on a side surface and a top surface of the light emitting structure layer,
wherein a top surface of the volume layer is disposed higher than a top surface of the passivation layer, and
wherein a bottom surface of the volume layer is disposed lower than the top surface of the passivation layer.

15. The light emitting device package according to claim 14, wherein the volume layer has a thickness of about 1 um to about 20 um.

16. The light emitting device package according to claim 14, wherein the volume layer is formed of at least one material of $SiO_2$, $SiO_x$, $SiO_xN_y$, $Si_3N_4$, $TiO_2$, and $Al_2O_3$.

17. The light emitting device package according to claim 14, wherein a light extraction pattern is disposed on one surface of the volume layer.

18. The light emitting device package according to claim 14, wherein a roughness is disposed on a side surface of the volume layer.

19. A light unit comprising:
a board;
a light emitting device disposed on the board; and
an optical member through which light emitted from the light emitting device passes, wherein the light emitting device comprises:
a support substrate;
a light emitting structure layer disposed on the support substrate, the light emitting structure layer comprising a first conductive type semiconductor layer, a second conductive type semiconductor layer, and an active layer disposed between the first conductive type semiconductor layer and the second conductive type semiconductor layer;
an electrode electrically connected to the first conductive type semiconductor layer;
a volume layer disposed on the light emitting structure layer, the volume layer having a thickness greater than a thickness of the electrode; and
a passivation layer disposed on a side surface and a top surface of the light emitting structure layer,
wherein a top surface of the volume layer is disposed higher than a top surface of the passivation layer, and
wherein a bottom surface of the volume layer is disposed lower than the top surface of the passivation layer.

20. The light emitting device according to claim 1, wherein the top surface of the passivation layer contacts a side surface of the volume layer.

21. The light emitting device according to claim 1, wherein the passivation layer contacts the second conductive type semiconductor layer and the active layer.

22. The light emitting device according to claim 1, wherein a bottom surface of the volume layer is disposed lower than the top surface of the passivation layer.

* * * * *